(12) United States Patent
Heinrich et al.

(10) Patent No.: US 8,383,510 B2
(45) Date of Patent: Feb. 26, 2013

(54) SEMICONDUCTOR DEVICE COMPRISING METALLIZATION LAYERS OF REDUCED INTERLAYER CAPACITANCE BY REDUCING THE AMOUNT OF ETCH STOP MATERIALS

(75) Inventors: Jens Heinrich, Wachau (DE); Torsten Huisinga, Dresden (DE); Ralf Richter, Dresden (DE); Ronny Pfuetzner, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 67 days.

(21) Appl. No.: 13/040,399

(22) Filed: Mar. 4, 2011

(65) Prior Publication Data

US 2012/0223437 A1 Sep. 6, 2012

(51) Int. Cl.
*H01L 21/4763* (2006.01)

(52) U.S. Cl. ........ 438/629; 438/970; 438/622; 438/637; 257/E21.577

(58) Field of Classification Search .................. 438/970, 438/622, 629, 637; 257/E21.577
See application file for complete search history.

(56) References Cited

U.S. PATENT DOCUMENTS

| | | | | |
|---|---|---|---|---|
| 6,110,648 | A * | 8/2000 | Jang | 430/312 |
| 6,312,874 | B1 * | 11/2001 | Chan et al. | 430/314 |
| 6,603,206 | B2 * | 8/2003 | Wang et al. | 257/774 |
| 6,727,169 | B1 * | 4/2004 | Raaijmakers et al. | 438/622 |
| 7,232,748 | B2 * | 6/2007 | Ali | 438/618 |
| 7,862,989 | B2 * | 1/2011 | Colburn et al. | 430/320 |
| 7,982,312 | B2 * | 7/2011 | Colburn et al. | 257/758 |
| 2002/0173152 | A1 * | 11/2002 | Chen et al. | 438/691 |
| 2003/0224595 | A1 * | 12/2003 | Smith et al. | 438/637 |
| 2004/0185655 | A1 * | 9/2004 | Jiang et al. | 438/636 |
| 2006/0264033 | A1 * | 11/2006 | Olmen et al. | 438/637 |
| 2010/0078825 | A1 * | 4/2010 | Patz et al. | 257/774 |

* cited by examiner

*Primary Examiner* — Nitin Parekh
(74) *Attorney, Agent, or Firm* — Williams, Morgan & Amerson

(57) ABSTRACT

Upon forming a complex metallization system, the parasitic capacitance between metal lines of adjacent metallization layers may be reduced by providing a patterned etch stop material. In this manner, the patterning process for forming the via openings may be controlled in a highly reliable manner, while, on the other hand, the resulting overall dielectric constant of the metallization system may be reduced, thereby also significantly reducing the parasitic capacitance between stacked metal lines.

17 Claims, 5 Drawing Sheets

SEMICONDUCTOR DEVICE COMPRISING METALLIZATION LAYERS OF REDUCED INTERLAYER CAPACITANCE BY REDUCING THE AMOUNT OF ETCH STOP MATERIALS

BACKGROUND OF THE INVENTION

1. Field of the Invention

Generally, the present disclosure relates to microstructures, such as advanced integrated circuits, and, more particularly, to conductive structures, such as copper-based metallization layers, comprising metal lines and vias.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area as typically the number of interconnections required increases more rapidly than the number of circuit elements. Thus, usually a plurality of stacked "wiring" layers, also referred to as metallization layers, is provided, wherein individual metal lines embedded in a dielectric material of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance modern CPUs, memory chips, ASICs (application specific ICs) and the like.

Advanced integrated circuits, including transistor elements having a critical dimension of 0.05 μm and even less, may, therefore, typically be operated at significantly increased current densities of up to several kA per cm² in the individual interconnect structures, despite the provision of a relatively large number of metallization layers, owing to the significant number of circuit elements per unit area. Consequently, well-established materials, such as aluminum, are being replaced by copper and copper alloys, i.e., materials with significantly lower electrical resistivity and improved resistance to electromigration even at considerably higher current densities, compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers.

Another characteristic of copper significantly distinguishing it from aluminum is the fact that copper may not be readily deposited in larger amounts by chemical and physical vapor deposition techniques and it does not form volatile etch byproducts when exposed to currently established etch processes, thereby requiring a process strategy that is commonly referred to as the damascene or inlaid technique. In the damascene process, first a dielectric layer is formed, which is then patterned to include trenches and/or vias which are subsequently filled with copper, wherein, prior to filling in the copper, a conductive barrier layer is formed on sidewalls of the trenches and via openings. The deposition of the bulk copper material into the trenches and via openings is usually accomplished by wet chemical deposition processes, such as electroplating and electroless plating, thereby requiring the reliable filling of vias with an aspect ratio of 5 and more with a diameter of 0.3 μm or even less in combination with trenches having a width ranging from 0.1 μm to several μm.

In addition, to achieve high production yield and superior reliability of the metallization system, it is also important to accomplish these goals on the basis of a high overall throughput of the manufacturing process under consideration. For instance, the so-called dual damascene process is frequently used, in which a via opening and a corresponding trench are filled in a common deposition sequence, thereby providing superior process efficiency.

In the damascene technique or inlaid technique, typically, the patterning of the via openings and the trenches may require sophisticated lithography techniques since the shrinkage of critical dimensions in the device layer, i.e., for transistors and other semiconductor circuit elements, may also require a corresponding adaptation of the critical dimensions of the vias and metal lines to be formed in the metallization system. In some well-established process techniques, a patterning regime may be used, which may commonly be referred to as "via first-trench last" approach, in which at least a portion of a via opening may be formed first on the basis of a specific etch mask and thereafter a corresponding trench mask may be provided in order to form a corresponding trench in the upper portion of the dielectric material, wherein, depending on the overall process strategy, during the trench etch process, the remaining portion of the via opening may also be completed, while, in other cases, the via opening may be provided such that it extends down to a bottom etch stop layer, which may then be opened after or upon completing the trench etch process.

With reference to FIG. 1, a typical process flow for forming a complex metallization system will now be described in more detail. FIG. 1 schematically illustrates a cross-sectional view of a semiconductor device 100 comprising a substrate 101, above which is formed a metallization system 150. The metallization system 150 typically provides the required electrical connections between a plurality of circuit elements 110, which are formed in and above a semiconductor layer 102. For example, the semiconductor layer 102 may represent any appropriate semiconductor material, such as a silicon material, a silicon/germanium material and the like, in order to form therein any complex circuit elements, such as field effect transistors, bipolar transistors, resistors, capacitors and the like. It should be appreciated that the semiconductor layer 102 in combination with the substrate 101 may represent a bulk configuration in which the semiconductor material of the layer 102 is directly in contact with a crystalline substrate material, while, in other cases (not shown), a buried insulating material, such as a silicon dioxide material and the like, may be provided so as to form a silicon-on-insulator (SOI) configuration. As discussed above, the circuit elements 110 may have critical dimensions, such as a gate length of a field effect transistor, of 50 nm and less, if highly complex applications are considered. Typically, the semiconductor-based circuit elements 110 are embedded in an appropriate dielectric material or material system 121 of a contact level 120, which in turn comprises appropriate contact elements 122, i.e., highly conductive vertical connections, which finally connect the circuit elements 110 with the metallization system 150.

As explained above, the metallization system 150 typically comprises a plurality of metallization layers, depending on the overall complexity of the device 100. For convenience, a first metallization layer 130 and a second metallization layer 140 are illustrated in FIG. 1. The metallization layer 130 comprises a dielectric material 131, such as a low-k dielectric material, a ULK material and the like. Furthermore, a metal line or region 132 is formed in the dielectric material 131 and typically comprises a highly conductive core metal 132A, such as copper, copper alloys and the like, in combination with an appropriate barrier material or material system 132B. For example, tantalum, tantalum nitride and the like are well-established barrier materials for copper-based metallization systems.

Similarly, the metallization layer 140 comprises an appropriate dielectric material 141, such as a low-k dielectric material, a ULK material and the like, in which are formed metal regions 142, such as metal lines 142L in combination with appropriate vertical contacts, which are referred to herein as vias 142V. Also in this case, a highly conductive core metal 142A in combination with a barrier material or material system 142B is typically applied. Furthermore, as a part of the metallization layer 130 or the metallization layer 140, an etch stop layer 135 is typically provided, which may be efficiently used as an etch control mechanism upon forming the vias 142V, as will be explained later on in more detail.

As discussed above, in highly complex semiconductor devices, the overall performance is typically significantly affected by the propagation delay caused by the metallization system 150, which is addressed by using highly conductive metals in combination with dielectric materials of reduced permittivity. In this manner, the parasitic capacitance between the metal lines 142L and any lower-lying metal lines, such as the metal line 132, are thus significantly influenced by the dielectric characteristics of the materials 141 and 135. Since the layer 135 has to provide sufficient etch stop capabilities, possibly in combination with cap layer capabilities for providing superior electromigration behavior of the metal line 132, it is very difficult to find appropriate materials with reduced dielectric constant, while also a significant reduction in overall thickness is less than desirable, in particular in view of the etch control capabilities required for patterning the dielectric material 141. For this reason, frequently, the dielectric constant of the material 141 is further reduced, for instance by incorporating ULK materials, which, however, may exhibit a significantly reduced mechanical and chemical stability.

The semiconductor device 100 as illustrated in FIG. 1 may be formed on the basis of the following processes. The circuit elements 110 in and above the semiconductor material 102 are formed on the basis of any appropriate process technique, including complex lithography techniques, etch techniques, deposition techniques, implantation processes, anneal processes and the like, in order to obtain the circuit elements 110 having the desired critical dimensions. After any high temperature processes, the contact level 120 is typically provided, for instance, by depositing the dielectric material or materials 121, planarizing the same and performing a complex patterning process for forming openings therein, which are subsequently filled with an appropriate conductive material, such as tungsten and the like. Thereafter, any excess material is removed and the metallization system 150 may be formed, for instance, by depositing an appropriate dielectric material and patterning the same. A corresponding manufacturing flow will now be described for the metallization layer 140, wherein it should be appreciated that a similar process sequence may also be applied to any lower-lying metallization layer, such as the metallization layer 130, and also to any further metallization layer that may possibly be required above the metallization layer 140.

After forming the metal lines 132, the etch stop layer 135 may be formed, for instance, by appropriate deposition techniques including plasma enhanced chemical vapor deposition (CVD) and the like, wherein, typically, at least one layer including a silicon nitride-based material is used due to its very efficient copper diffusion blocking effect and the etch stop capability with respect to plasma assisted etch recipes, which are typically used for patterning the plurality of low-k and ULK materials. Typically, silicon nitride-based dielectric materials may have a dielectric constant of 4.0 and higher, which may, therefore, unduly increase parasitic capacitance 144. Thereafter, the dielectric material 141 is formed, for instance by spin-on techniques, CVD and the like, possibly in combination with additional treatments in order to adjust the finally desired dielectric constant. For example, frequently, the material 141 is provided in the form of a porous material in order to further reduce the dielectric constant. In many conventional approaches, the dielectric constant of the material 141 is reduced in order to compensate or even over-compensate for the contribution of the layer 135 to the total parasitic capacitance 144. After the deposition of the material 141 and adjusting its material characteristics, if required, for instance by radiation treatment and the like, a complex patterning sequence is applied in which, typically, an appropriate etch mask is provided, which may be obtained on the basis of appropriate lithography masks, which thus determine the lateral position and size and shape of the metal features 142. In the "via first-trench last" approach, a first etch mask is applied and used for patterning the dielectric material 141, at least to a certain depth, followed by a further patterning process in which an etch mask for defining the size and position of trenches is produced. During the patterning of respective via openings or during a final phase of a common etch process for increasing the depth of the previously formed via and the trenches, the etch stop layer 135 is used as an efficient etch control mechanism in which the high etch resistivity enables appropriate over-etch times so as to reliably form the via openings across the entire die regions and also across the entire substrate 101. Thereafter, the etch stop layer 135 is opened in a dedicated etch step so as to connect to the metal line 132. Thereafter, the barrier material 142B followed by the highly conductive core metal 142A are deposited by using well-established process techniques, followed by the removal of any excess material, for instance by chemical mechanical polishing or planarization (CMP) and the like.

As indicated above, upon further reducing the overall device dimensions, the parasitic capacitance 144 may be increased, for instance, by reducing the distance between the metal lines 142L and 132, which is typically compensated for by further reducing the dielectric constant of the material 141, while a pronounced reduction of the dielectric characteristics of the etch stop layer 135 is typically limited due to the required etch stop capabilities and due to the fact that the thickness of the layer 135 may not be arbitrarily reduced. It has been observed, however, that a further reduction of the dielectric constant of the material 141 may result in significant instabilities of the metallization system 150, while also increased etch damage may occur upon patterning the material 141, which may result in a compensation or even an increase of the finally obtained dielectric constant. That is, upon exposure of the material 141 to the reactive etch atmosphere, the surface characteristics may significantly change such that polar molecules such as OH-groups and the like may preferably adhere to the exposed surface areas, thereby locally significantly increasing the dielectric constant, which in turn may negatively affect the resulting parasitic capacitance 144.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques and semiconductor devices in which the dielectric material of a metallization layer may be patterned on the basis of an appropriate etch stop material which, however, may not unduly contribute to the overall parasitic capacitance of the metallization system. To this end, the etch stop materials may be provided in a locally restricted manner, thereby forming via receiving regions which may enable a reliable patterning of via openings while the presence of the etch stop material or materials may be avoided, in particular in areas that are critical with respect to the parasitic capacitance. For this purpose, an appropriate etch stop layer or layer system may be patterned so as to form the laterally restricted via receiving regions prior to depositing the dielectric material of the next metallization layer so that, during the subsequent patterning process for forming the via openings, the corresponding etch process may be reliably controlled on the basis of the locally restricted via receiving regions.

One illustrative method disclosed herein comprises forming an etch stop layer above a first dielectric material of a first metallization layer of a semiconductor device, wherein the first metallization layer comprises a first metal line. The method further comprises patterning the etch stop layer so as to form a via receiving region from the etch stop layer. Additionally, the method comprises forming a second dielectric material of a second metallization layer above the first metallization layer and above the via receiving region. The method further comprises forming a via and a second metal line in the second dielectric material, wherein the via extends through the via receiving region so as to connect to the first metal line.

A further illustrative method disclosed herein relates to forming a via and a metal line of a metallization system of a semiconductor device. The method comprises forming a via receiving region above a first metal line of a first metallization layer of the metallization system, wherein the via receiving region comprises an etch stop material. The method further comprises forming a dielectric material of a second metallization layer above the first metallization layer. Moreover, a via opening is formed in the dielectric material of the second metallization layer by using the via receiving region as an etch stop. The method further comprises forming a trench in the dielectric material of the second metallization layer, wherein the trench connects to the via opening. Additionally, the via opening and the trench are filled with a conductive material.

One illustrative semiconductor device disclosed herein comprises a first metallization layer comprising a first dielectric material and a first metal region that is laterally embedded in the first dielectric material, wherein the first metal region has a first lateral metal extension in a first lateral direction and has a second lateral metal extension in a second lateral direction. The semiconductor device further comprises a via receiving region comprising an etch stop material, wherein the via receiving region is formed above the first metal region and has a first lateral extension and a second lateral extension in the first and second lateral directions, respectively. Furthermore, at least one of the first and second lateral extensions is less than at least one of the first and second lateral metal extensions. The semiconductor device further comprises a second metallization layer formed above the first metallization layer and comprising a second metal region and a via which extends through the via receiving region and into the first metal region.

BRIEF DESCRIPTION OF THE DRAWINGS

The disclosure may be understood by reference to the following description taken in conjunction with the accompanying drawings, in which like reference numerals identify like elements, and in which.

Figure 1:
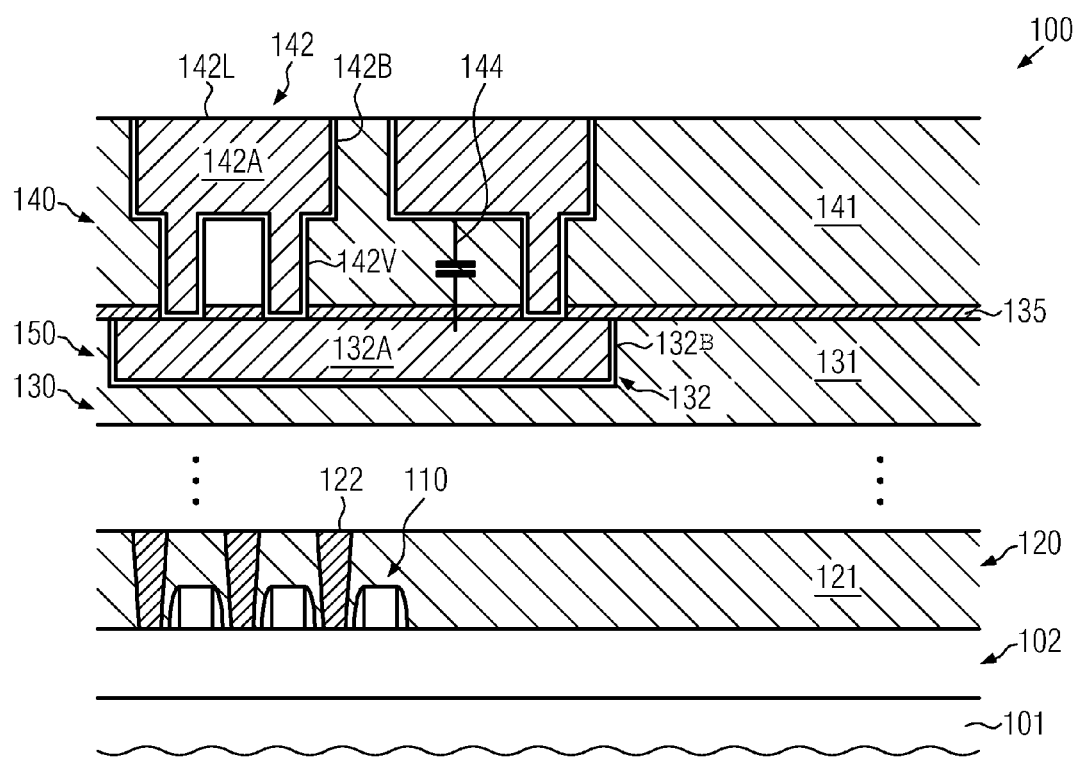
FIG. 1 schematically illustrates a cross-sectional view of a semiconductor device comprising a complex metallization system formed on the basis of conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally contemplates semiconductor devices and manufacturing techniques in which a reliable patterning of dielectric materials of metallization systems may be accomplished on the basis of an etch stop material, which may be provided in a laterally restricted manner so that the overall influence of the etch stop material on the finally obtained dielectric characteristics of the metallization system and thus on the resulting parasitic capacitance may be significantly reduced compared to conventional strategies. To this end, an appropriate etch stop material or material system may be provided and may be patterned into corresponding via receiving regions, which are to be understood as regions having a restricted lateral extension in order to reduce the overall amount of etch stop material while nevertheless ensuring a reliable patterning of via openings. That is, the via receiving portions are provided with appropriate lateral dimensions and at positions which substantially correspond to the positions of the vias to be formed, while at the same time providing respective process margins in order to take into account any alignment imperfections that may occur upon patterning the dielectric material of the next metallization layer. In this manner, appropriate etch stop capabilities may be provided without unduly reducing the overall thickness or being restricted to material compositions of reduced dielectric constant values. Furthermore, in view of the overall influence of the etch stop material or material system on the total finally obtained dielectric constant, the actual interlayer dielectric material may be selected with a less critical permittivity value, which may thus provide enhanced overall mechanical stability and a reduced degree of etch damaging, which may conventionally be observed in ULK materials.

The patterning of the etch stop material may be accomplished on the basis of lithography techniques using, for instance, a lithography mask that substantially complies with the lithography mask used for forming an etch mask for patterning the via opening, wherein appropriate exposure conditions may be applied in order to appropriately "increase" the resulting via receiving regions. To this end, a negative resist may be used with appropriate exposure parameters so that the position coordinates of the via receiving regions are substantially determined by the same position coordinates that will be used for defining the via openings, wherein the specifically adapted exposure parameters may then provide a desired lateral increase, which in turn may ensure a "buffer" with respect to any alignment inaccuracies. In other cases, a positive resist material may be applied on the basis of a lithography mask, which may thus represent a substantially inverse image of a lithography mask that may be used for defining the via openings. In this case, the corresponding lateral dimensions of the via receiving regions may be incorporated into the lithography mask by appropriately selecting the dimensions of the mask features.

In some illustrative embodiments, an appropriate cap material may be provided, at least on surface portions of an underlying metal line or metal region, above which the etch stop material is to be removed. To this end, in some cases, conductive cap materials, such as well-established alloys, may be provided on the basis of self-aligned electrochemical deposition techniques prior to, if a substantially continuous cap layer may be considered appropriate, or after forming the via receiving region, when the dielectric cap layer is to be provided selectively on surface areas which are not covered by the via receiving regions. In this manner, the electromigration characteristics of the metal lines may be improved, if required, without contributing to the overall parasitic capacitance, as may be the case in conventional strategies in which etch stop materials and dielectric cap materials are provided prior to forming the low-k dielectric material.

With reference to FIGS. 2a-2g, further illustrative embodiments will now be described in more detail, wherein reference may also be made to FIG. 1, if required.

Figure 2A:
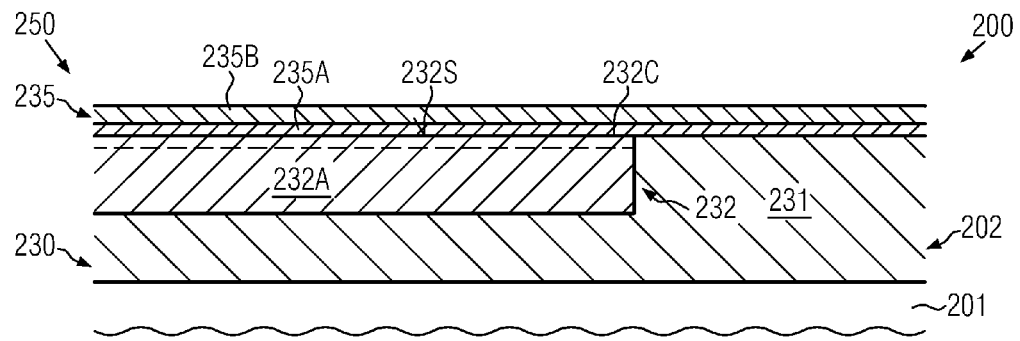
FIGS. 2a-2c schematically illustrate cross-sectional views of a semiconductor device during various manufacturing stages in forming a metallization system by reducing the amount of etch stop material, according to illustrative embodiments.

FIG. 2a schematically illustrates a cross-sectional view of a semiconductor device 200 in which a metallization system 250 may be formed above a substrate 201. With respect to the substrate 201 and any semiconductor-based material including circuit elements and the like, it may be referred to the semiconductor device 100 described with reference to FIG. 1. Similarly, the metallization system 250 may comprise a plurality of metallization layers, wherein, in the manufacturing stage shown, a metallization layer 230 is illustrated, wherein it should be appreciated that one or more metallization layers may also be provided below the metallization layer 230. In the manufacturing stage shown, the metallization layer 230 may comprise a dielectric material 231, such as a low-k dielectric material, a conventional dielectric material or a combination thereof, in which is laterally embedded a metal region 232, for instance in the form of a metal line. As also previously explained, the metal region 232 may comprise any appropriate barrier material (not shown), if required, and an appropriate core metal 232A, such as copper, silver, copper alloys, aluminum and the like, may be provided. Moreover, in some illustrative embodiments, an additional dielectric cap material 232C may be formed on a top surface 232S of the metal region 232. For example, the cap layer 232C may be comprised of any appropriate material imparting superior electromigration behavior to the core metal 232A, while also providing superior adhesion and confining capabilities, for instance with respect to copper, for which undue diffusion into the dielectric material 232 is to be avoided. For example, the plurality of ternary alloys, for instance comprising cobalt, boron, phosphorous, molybdenum and the like, are well established in the art. In other illustrative embodiments, a cap material 232C may be omitted or may be provided in a later manufacturing stage in a locally restricted manner. Furthermore, an etch stop layer 235 may be formed above the dielectric material 231 and may have any appropriate material characteristics as required for providing the etch stop capabilities considered appropriate for the further processing of the device 200. For example, the etch stop layer 235 may comprise a silicon nitride material, possibly in combination with other components, such as carbon, silicon dioxide and the like. In one illustrative embodiment, as shown in FIG. 2a, the etch stop layer 235 may represent a layer system comprising a first layer or sub-layer 235A and a second layer or sub-layer 235B, wherein the layers 235A, 235B may exhibit a different etch behavior and may thus differ in their material composition. For example, the layer 235B may provide the required etch stop capabilities during the further processing upon patterning a dielectric material of a further metallization layer, while the layer 235A may provide etch stop capabilities for patterning the layer 235B, wherein the layer 235A may then be removed at any exposed device areas without unduly affecting any other materials. For example, the layer 235A may be provided in the form of a silicon dioxide material having a thickness of approximately 5-20 nm, depending on the overall device requirements. On the other hand, the layer 235B may represent a silicon nitride-based material having an appropriate thickness of, for instance, 5-50 nm, while also any other thickness values may be selected, depending on the specific application.

The semiconductor device 200 as shown in FIG. 2a may be formed on the basis of any appropriate process strategy. For example, any circuit elements formed in and above a semiconductor material may be fabricated on the basis of manufacturing techniques, as also described above with reference to the semiconductor device 100. The metallization layer 230 may be formed by depositing the material 231 and patterning the same, which may include similar process techniques as will be described in more detail later on. After completing the metal region 232, in some cases, a selective electrochemical deposition process may be applied, thereby selectively forming the cap layer 232C on at least the core metal 232A, thereby passivating and confining this material. Next, the etch stop layer 235 may be deposited, for instance by CVD and the like, and two or more separate deposition steps may be applied if two or more of the sub-layers 235A, 235B are to be provided.

Figure 2B:
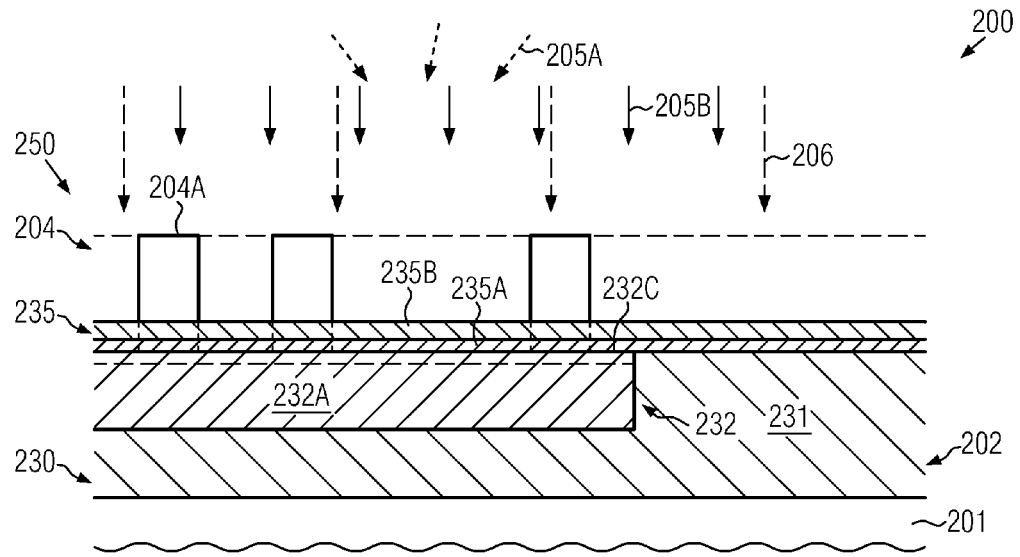

FIG. 2b schematically illustrates the device 200 in a further advanced manufacturing stage. As shown, an etch mask 204A may be formed above the etch stop layer 235 and may include respective mask features, which thus substantially define the position and the lateral size and shape of via receiving regions to be formed from the etch stop layer 235. To this end, the etch mask 204A may be provided in the form of a resist layer 204, which may be provided in the form of a negative resist material, in some illustrative embodiments, so that exposure during a lithography process 206, based on a lithography mask (not shown) that may substantially correspond to a mask for defining the size and position of via openings to be formed in a later manufacturing stage, may result in non-soluble resist portions, i.e., the mask features 204A, which may not be removed during a subsequent development process. In this case, any exposure parameters, such as exposure dose and exposure time, may be adjusted such that a certain degree of "over-exposure" may be achieved, thereby increasing the lateral dimensions of the mask features 204A, which thus results in a desired process tolerance with respect to any misalignments during the subsequent patterning of via openings.

In other cases, the lithography process 206 may be performed on the basis of a lithography mask (not shown) which may result in the exposure of the resist material 204 such that the mask features 204A may be preserved and may have the desired lateral dimensions. Consequently in both cases, i.e., negative resist material or positive resist material, respective lithography masks may be applied in which the position information for the via openings to be formed may be efficiently used for controlling the corresponding lithography process 206.

On the basis of the etch mask 204A, an appropriate etch process may be performed so as to pattern the etch stop layer 235 to obtain corresponding via receiving regions. In some illustrative embodiments, a first etch process 205B may be applied so as to etch through the layer 235B, while using the layer 235A as an efficient etch stop material. Thereafter, exposed areas of the layer 235A may be removed on the basis of a further etch process 205A, which may be performed, for instance, as a wet chemical etch process, substantially without significantly affecting other materials. For example, in the case of silicon dioxide material, the process 205A may be applied in the form of an HF (hydrofluoric acid) chemistry.

In some illustrative embodiments, after the removal of the etch mask 204A, or even in the presence thereof, an electrochemical deposition process may be applied in order to form the cap layer 232C on surface portions exposed by the previously patterned etch stop layer 235.

Figure 2C:
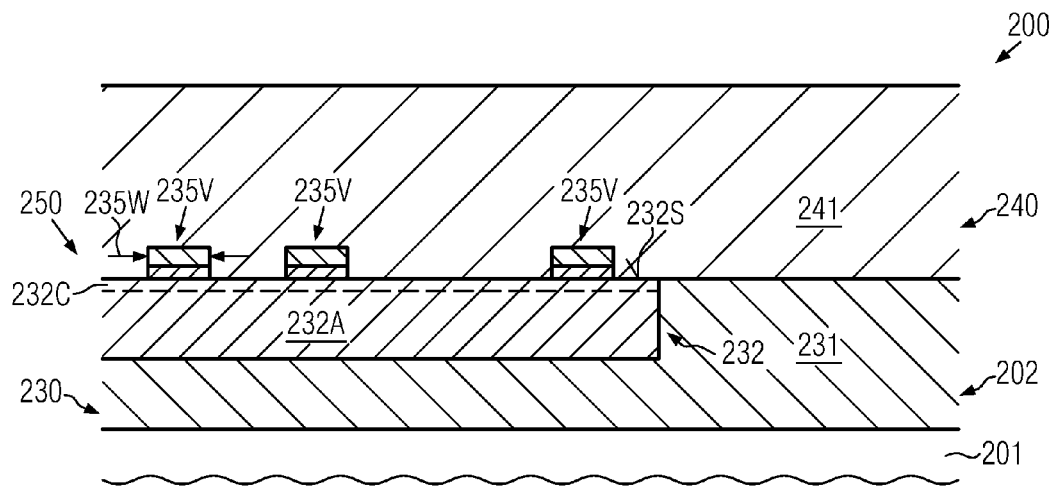

FIG. 2c schematically illustrates a cross-sectional view of the device 200 in a further advanced manufacturing stage. As shown, via receiving regions 235V may be formed from the etch stop layer 235 (FIG. 2b) and have appropriate lateral dimensions, such as a width 235W. Moreover, surface areas 232S between the via receiving regions 235V may be exposed, wherein, if required, the cap layer 232C may be provided, as discussed above. In other illustrative embodiments (not shown), a thin dielectric cap layer may be provided as the layer 232 at any appropriate manufacturing stage, i.e., prior to or after forming the etch stop layer 235 (FIG. 2b), wherein the corresponding cap material may be selected with respect to copper confining capabilities, adhesion and electromigration, rather than requiring etch stop capabilities, since the etch stop capabilities are provided by the regions 235V. For example, in some illustrative embodiments, a corresponding cap material may be deposited as a thin layer having a thickness of 5-10 nm upon forming a dielectric material 241 for the next metallization layer 240. The dielectric material 241 may be provided with less critical characteristics, for instance in view of porosity and generally dielectric constant, since the negative influence of an etch stop material may be significantly reduced by providing the laterally restricted etch stop regions or via receiving regions 235V.

Figure 2D:
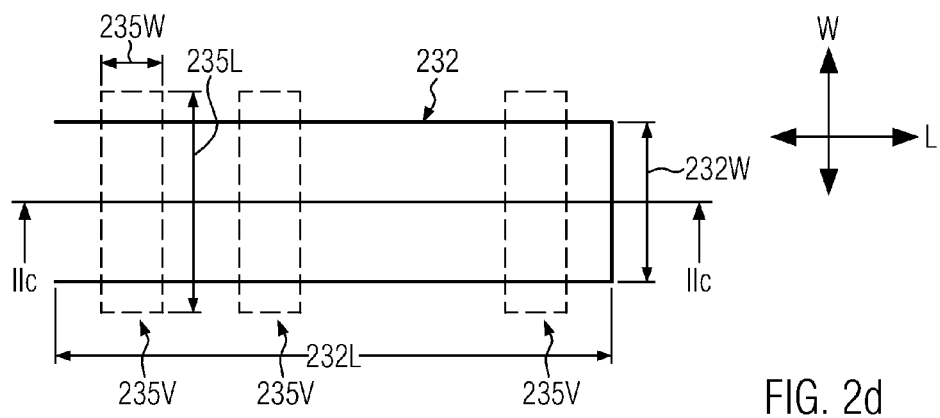
FIG. 2d schematically illustrates a top view of the device as shown in FIG. 2c.

FIG. 2d schematically illustrates a top view of the device 200. As illustrated, the via receiving regions 235V may have appropriate dimensions along a length direction, indicated by L, and a width direction, indicated by W. As shown, the lateral dimensions 235W, 235L may be selected so as to provide sufficient tolerance with respect to the further processing, i.e., the formation of via openings in the dielectric material 241 (FIG. 2c) without unduly covering the metal line 232. Consequently, at least one of the lateral dimensions 235L, 235W is significantly less compared to lateral dimensions 232W and 232L of the metal line 232. In this manner, a significant portion of the surface area of the metal line 232 is not covered by material of the regions 235V.

Figure 2E:
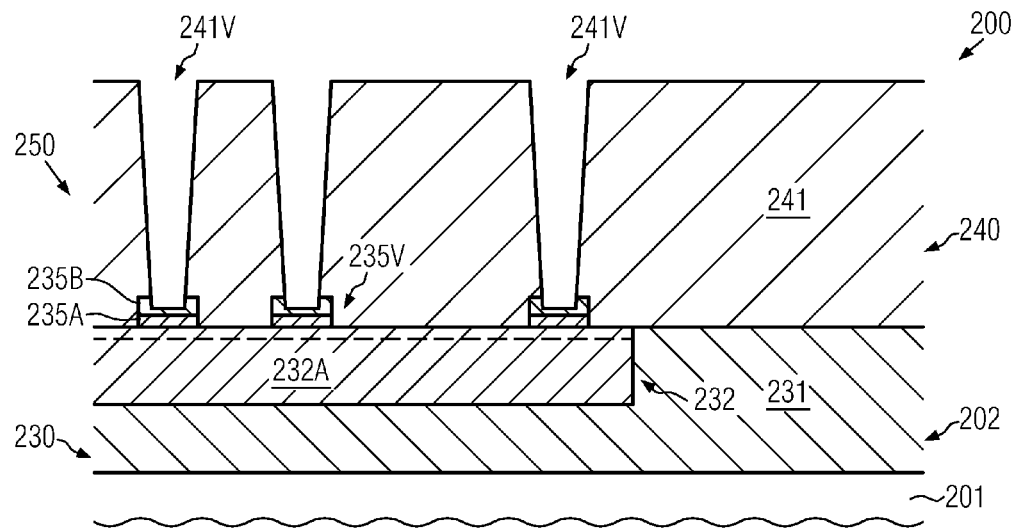
FIGS. 2e-2g schematically illustrate cross-sectional views of the semiconductor device in further advanced manufacturing stages according to illustrative embodiments.

FIG. 2e schematically illustrates the semiconductor device 200 in a further advanced manufacturing stage. As illustrated, via openings 241V may be formed in the dielectric material 241 so as to extend to and into the regions 235V. To this end, well-established patterning strategies may be applied, wherein, during a corresponding anisotropic etch process, the regions 235V, at least the layer 235B, may act as an efficient etch stop material. It should be appreciated that the via openings 241V may not necessarily extend to the regions 235V in this manufacturing stage but may extend to a certain depth, wherein the final depth of the vias 241V may be obtained in a subsequent etch process, in which concurrently a trench may be formed in the upper portion of the material 241.

Figure 2F:
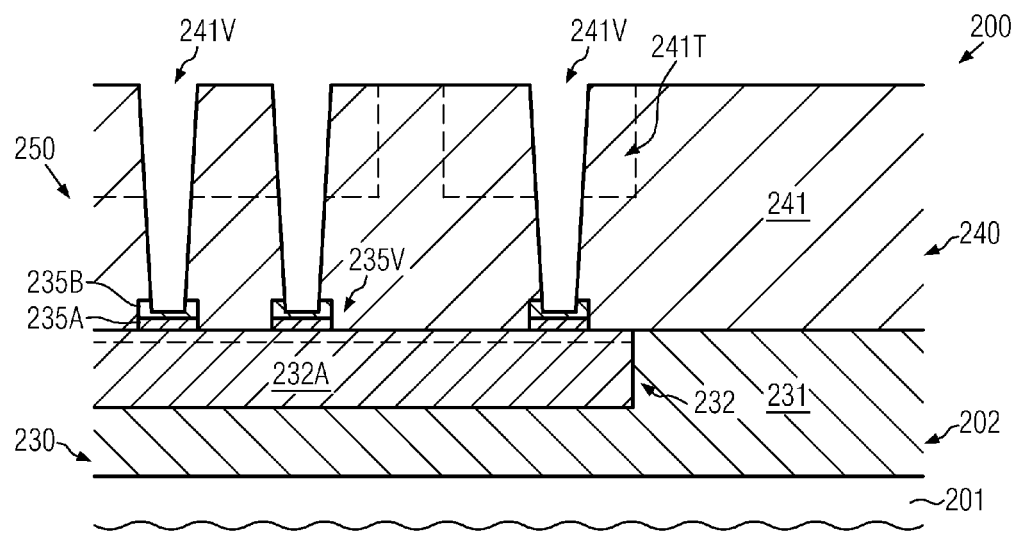

FIG. 2f schematically illustrates the device 200 wherein trenches 241T are indicated as dashed lines, which are to be formed in an upper portion of the dielectric material 241 so as to comply with the overall device layout. To this end, any well-established process strategies may be applied, as is also previously discussed with reference to the semiconductor device 100. At a final phase of a corresponding patterning process, the via receiving regions 235V may be opened so as to increase the depth of the via openings 241V in order to connect to the metal line 232, as is also previously discussed.

Figure 2G:
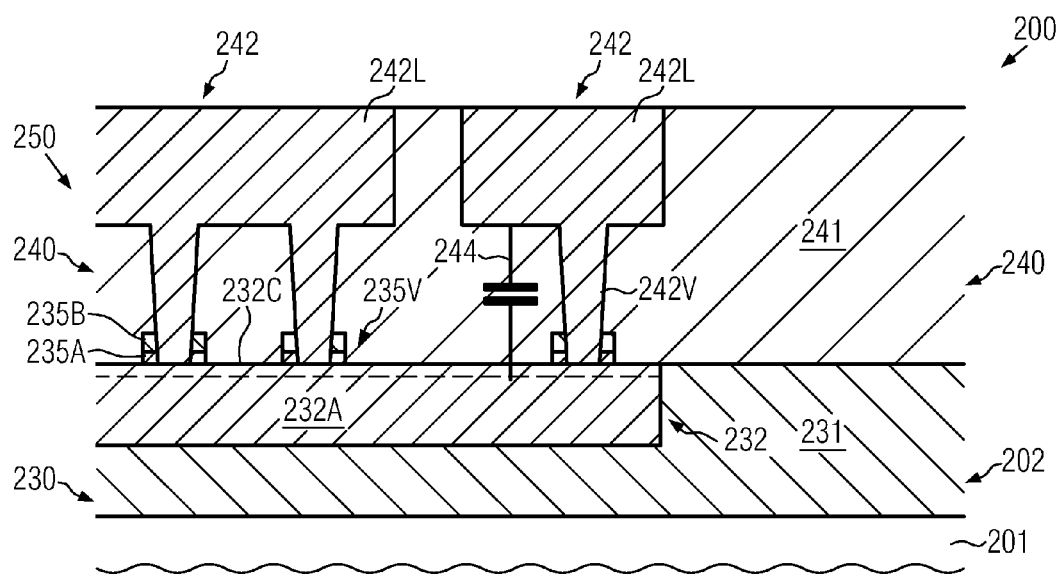

FIG. 2g schematically illustrates the semiconductor device 200 in a further advanced manufacturing stage. As shown, metal regions 242 are formed in the dielectric material 241, for instance in the form of metal lines 242L and vias 242V. To this end, any well-established deposition techniques may be applied, for instance by forming any barrier material or material systems (not shown), if required, followed by the deposition of an appropriate highly conductive metal, such as copper, copper alloys, silver and the like. After the removal of any excess material, the metal regions 242 may be provided as electrically isolated elements, wherein the further processing may be continued by depositing an etch stop material or any other appropriate material, depending on the overall complexity of the metallization system 250. Consequently, the vias 242V extend through the regions 235V, which have an appropriate lateral size so as to accommodate any misalignments upon forming the vias 242V, however, without unduly covering the remaining surface of the metal line 232. Hence, the parasitic capacitance 244 between the metal line 242L and the metal line 232 may be significantly reduced compared to a conventional configuration, as, for instance, shown in FIG. 1, for otherwise identical device parameters. On the other hand, for a given parasitic capacitance, less critical material characteristics may be selected for the material 241 compared to the conventional device 100 as shown in FIG. 1.

As a result, the present disclosure provides manufacturing techniques and semiconductor devices in which an etch stop material may be provided in a laterally restricted manner in order to enable a reliable patterning of via openings, while not unduly contributing to the overall dielectric constant of the metallization system. The laterally patterned etch stop material, i.e., the via receiving regions, may be provided in each metallization layer or in very critical metallization layers, depending on the overall process and device requirements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an etch stop layer above a first dielectric material of a first metallization layer of a semiconductor device, said first metallization layer comprising a first metal line;
    patterning said etch stop layer so as to form a via receiving region from said etch stop layer;
    forming a second dielectric material of a second metallization layer above said first metallization layer and said via receiving region; and
    forming a via and a second metal line in said second dielectric material, said via extending through said via receiving region so as to connect to said first metal line.

2. The method of claim 1, wherein patterning said etch stop layer comprises forming a resist mask by forming a resist material, exposing said resist material and removing a non-exposed portion of said resist material.

3. The method of claim 2, wherein said resist material is exposed on the basis of a lithography process controlled by using the same position coordinates used for forming said via.

4. The method of claim 1, wherein patterning said etch stop layer comprises forming a resist mask by forming a resist material, exposing said resist material and removing an exposed portion of said resist material.

5. The method of claim 4, wherein said resist material is exposed on the basis of a lithography process controlled by position coordinates excluding at least positions of said via.

6. The method of claim 1, wherein forming said etch stop layer comprises forming a first sub-layer and forming a second sub-layer above said first sub-layer, wherein said first and second sub-layers are selectively etchable with respect to each other.

7. The method of claim 6, wherein patterning said etch stop layer comprises performing an etch process so as to etch through said second sub-layer and use said first sub-layer as an etch stop.

8. The method of claim 7, further comprising removing an exposed portion of said first sub-layer by performing a second etch process.

9. The method of claim 8, wherein performing said second etch process comprises applying a wet chemical etch chemistry.

10. The method of claim 1, further comprising forming a cap layer on at least a portion of a top surface of said first metal line.

11. The method of claim 10, wherein said cap layer is formed as a conductive cap layer.

12. The method of claim 11, wherein said cap layer is formed after forming said via receiving regions.

13. A method of forming a via and a metal line of a metallization system of a semiconductor device, the method comprising:
    patterning an etch stop material to form a via receiving region from said etch stop material and above a first metal line of a first metallization layer of said metallization system;
    forming a dielectric material of a second metallization layer above said first metallization layer;
    forming a via opening in said dielectric material of said second metallization layer by using said via receiving region as an etch stop;
    forming a trench in said dielectric material of said second metallization layer, said trench connecting to said via opening; and
    filling said via opening and said trench with a conductive material.

14. The method of claim 13, wherein patterning said etch stop material to form said via receiving region comprises forming an etch mask from a negative resist material above said etch stop material and patterning at least a portion of said etch stop material by using said etch mask.

15. The method of claim 13, wherein patterning said etch stop material to form said via receiving region comprises forming an etch mask from a positive resist material above said etch stop material and patterning at least a portion of said etch stop material by using said etch mask.

16. The method of claim 13, wherein said via receiving region is formed so as to comprise at least a first layer and a second layer that differ in material composition.

17. The method of claim 13, further comprising forming a conductive cap layer on at least an exposed surface area of said first metal line.

* * * * *